US010176863B2

(12) United States Patent
Liaw

(10) Patent No.: US 10,176,863 B2
(45) Date of Patent: *Jan. 8, 2019

(54) MEMORY ARRAY WITH BIT-LINES CONNECTED TO DIFFERENT SUB-ARRAYS THROUGH JUMPER STRUCTURES

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/601,445

(22) Filed: May 22, 2017

(65) Prior Publication Data

US 2017/0256306 A1 Sep. 7, 2017

Related U.S. Application Data

(63) Continuation of application No. 15/061,573, filed on Mar. 4, 2016, now Pat. No. 9,659,635.
(Continued)

(51) Int. Cl.
*G11C 11/00* (2006.01)
*G11C 11/419* (2006.01)
(Continued)

(52) U.S. Cl.
CPC ............ *G11C 11/419* (2013.01); *H01L 28/00* (2013.01); *G11C 7/02* (2013.01); *G11C 7/065* (2013.01);
(Continued)

(58) Field of Classification Search
CPC ..... G11C 11/412; G11C 11/419; G11C 7/065; G11C 7/1012; G11C 2207/005; G11C 2207/002; G11C 7/18; G11C 7/02
(Continued)

(56) References Cited

U.S. PATENT DOCUMENTS 5,966,315 A 10/1999 Muller et al.
6,157,558 A 12/2000 Wong
(Continued)

FOREIGN PATENT DOCUMENTS

TW 201237867 A 9/2012

*Primary Examiner* — David Lam
(74) *Attorney, Agent, or Firm* — Slater Matsil, LLP

(57) ABSTRACT

An integrated circuit structure includes an SRAM array including a first sub-array having a first plurality of rows and a plurality of columns of SRAM cells, and a second sub-array having a second plurality of rows and the plurality of columns of SRAM cells. A first bit-line and a first complementary bit-line are connected to the first and the second pass-gate MOS devices of SRAM cells in a column in the first sub-array. A second bit-line and a second complementary bit-line are connected to the first and the second pass-gate MOS devices of SRAM cells in the column in the second sub-array. The first bit-line and the first complementary bit-line are disconnected from the second bit-line and the second complementary bit-line. A sense amplifier circuit is electrically coupled to, and configured to sense, the first bit-line, the first complementary bit-line, the second bit-line, and the second complementary bit-line.

20 Claims, 9 Drawing Sheets

Related U.S. Application Data

(60) Provisional application No. 62/288,811, filed on Jan. 29, 2016.

(51) Int. Cl.
*H01L 49/02* (2006.01)
*G11C 11/412* (2006.01)
*G11C 7/06* (2006.01)
*G11C 7/02* (2006.01)
*G11C 7/18* (2006.01)

(52) U.S. Cl.
CPC .............. *G11C 7/18* (2013.01); *G11C 11/412* (2013.01); *G11C 2207/002* (2013.01); *G11C 2207/005* (2013.01)

(58) Field of Classification Search
USPC ................... 365/156, 154, 205, 189.02, 207
See application file for complete search history.

(56) References Cited

U.S. PATENT DOCUMENTS

| | | | |
|---|---|---|---|
| 6,366,526 B2* | 4/2002 | Naffziger | G11C 8/10 365/154 |
| 6,738,279 B1 | 5/2004 | Kablanian | |
| 7,092,279 B1 | 8/2006 | Sheppard | |
| 7,236,396 B2 | 6/2007 | Houston et al. | |
| 8,437,178 B2 | 5/2013 | Chiu et al. | |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,811,068 B1 | 8/2014 | Clark et al. | |
| 9,177,637 B1 | 11/2015 | Grover et al. | |
| 9,191,022 B2 | 11/2015 | McLaury | |
| 9,659,635 B1* | 5/2017 | Liaw | G11C 11/419 |
| 2001/0010642 A1 | 8/2001 | Naffziger et al. | |
| 2004/0090818 A1 | 5/2004 | Liaw | |
| 2008/0031029 A1* | 2/2008 | Liaw | G11C 7/18 365/63 |
| 2008/0290374 A1* | 11/2008 | Tang | G11C 7/18 257/202 |
| 2011/0149667 A1* | 6/2011 | Hamzaoglu | G11C 11/412 365/203 |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |

* cited by examiner

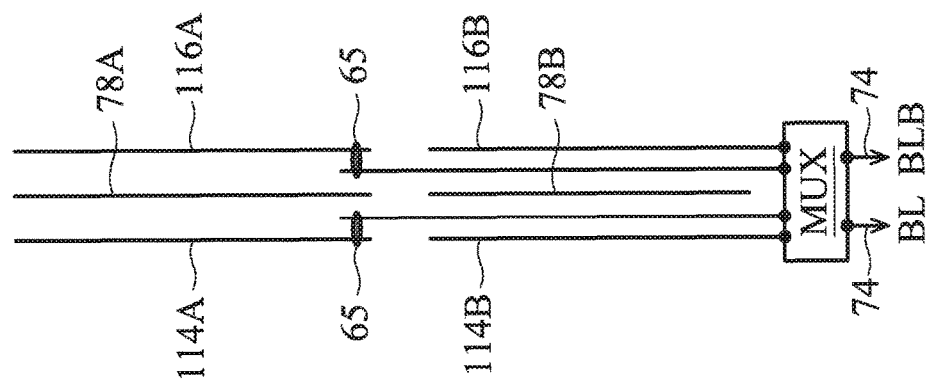

MEMORY ARRAY WITH BIT-LINES CONNECTED TO DIFFERENT SUB-ARRAYS THROUGH JUMPER STRUCTURES

PRIORITY CLAIM AND CROSS-REFERENCE

This application is a continuation of U.S. patent application Ser. No. 15/061,573, entitled "Memory Array with Bit-Lines Connected To Different Sub-Arrays Through Jumper Structures," filed on Mar. 4, 2016, now U.S. Pat. No. 9,659,635, which application claims the benefit of the following provisionally filed U.S. Patent application: Application Ser. No. 62/288,811, filed Jan. 29, 2016, and entitled "High Speed Memory Chip;" which applications are hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. With the increasingly down-scaling of the already very small SRAM cells, however, such request is difficult to achieve. For example, the sheet resistance of metal lines, which form the word-lines and bit-lines of SRAM cells, becomes increasingly higher, and hence the RC delay of the word lines and bit-lines of SRAM cells is increased, preventing the improvement in the read speed and write speed.

When entering into nanometer era, SRAM cells are made very large to increase the SRAM cell efficiency. This, however, incurs two problems. Firstly, each bit-line has to be connected to more rows of SRAM cells, which induces higher bit-line metal coupling capacitance, and hence the differential speed of the differential bit-lines (bit-line and bit-line bar) is reduced. Secondly, each word-line also has to be connected to more columns of SRAM cells, resulting in longer word-lines and hence worsened resistance and increased RC delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 illustrates complementary bit-lines and two CVdd lines connected to two sub-arrays in accordance with some embodiments.

DETAILED DESCRIPTION

Figure 1:
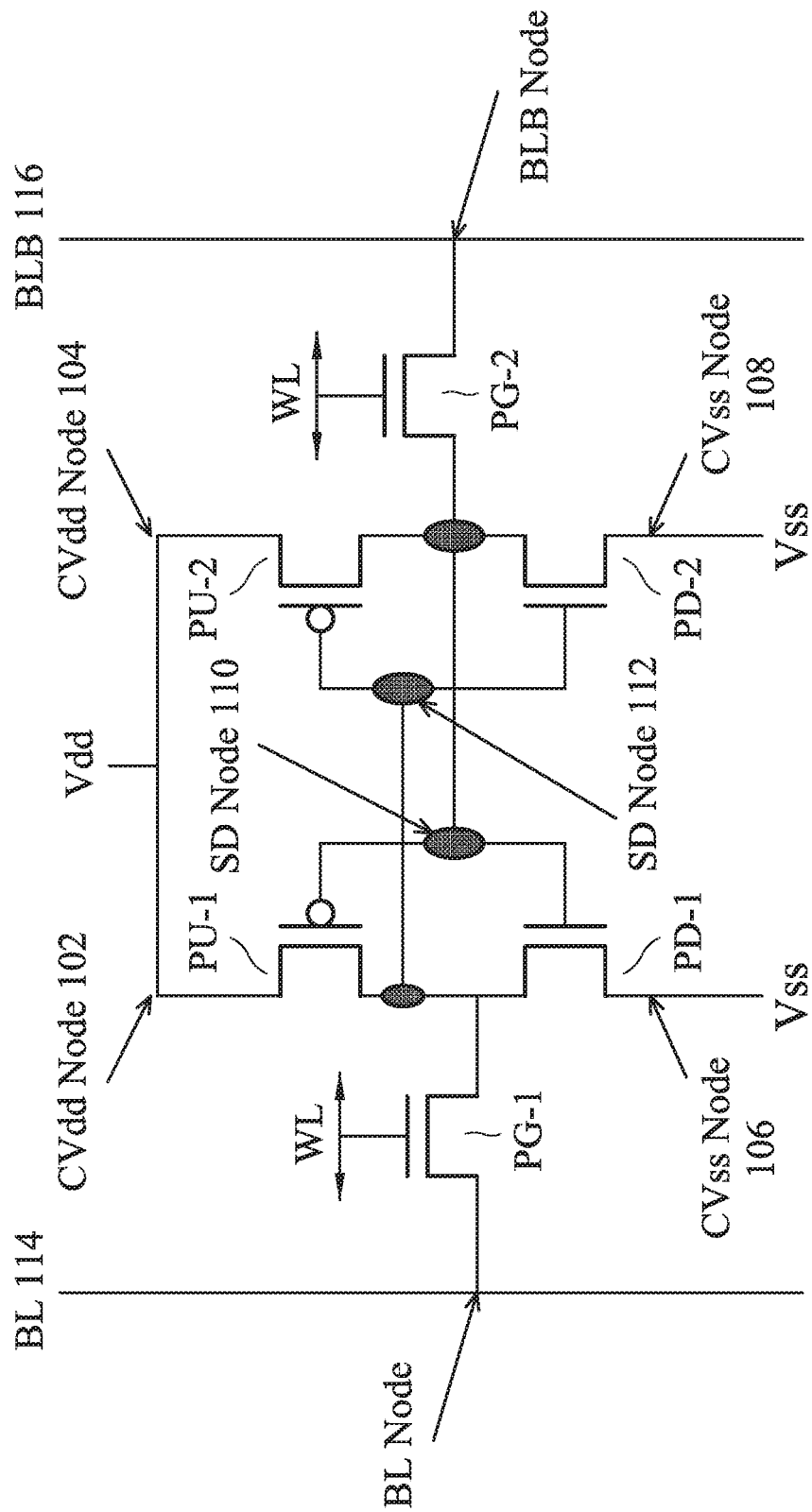
FIGS. 1 and 2 illustrate circuit diagrams of a Static Random Access Memory (SRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Static Random Access Memory (SRAM) cell and the corresponding SRAM array are provided in accordance with various exemplary embodiments. Some variations of some embodiments are discussed. Throughout the various views and illustrative embodiments, like reference numbers are used to designate like elements.

FIG. 1 illustrates a circuit diagram of SRAM cell 10 in accordance with some embodiments. SRAM cell 10 includes pull-up transistors PU-1 and PU-2, which are P-type Metal-Oxide-Semiconductor (PMOS) transistors, and pull-down transistors PD-1 and PD-2 and pass-gate transistors PG-1 and PG-2, which are N-type Metal-Oxide-Semiconductor (NMOS) transistors. The gates of pass-gate transistors PG-1 and PG-2 are controlled by word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in Storage Date (SD) node 110 and SD node 112. The stored bit can be written into, or read from, SRAM cell 10 through complementary bit lines including bit-line (BL) 114 and bit-line bar (BLB) 116. SRAM cell 10 is powered through a positive power supply node Vdd that has a positive power supply voltage (also denoted as VDD). SRAM cell 10 is also connected to power supply voltage VSS (also denoted as Vss), which may be an electrical ground. Transistors PU-1 and PD-1 form a first inverter. Transistors PU-2 and PD-2 form a second inverter. The input of the first inverter is connected to transistor PG-1 and the output of the second inverter. The output of the first inverter is connected to transistor PG-2 and the input of the second inverter.

The sources of pull-up transistors PU-1 and PU-2 are connected to CVdd node 102 and CVdd node 104, respectively, which are further connected to power supply voltage (and line) Vdd. The sources pull-down transistors PD-1 and PD-2 are connected to CVss node 106 and CVss node 108, respectively, which are further connected to power supply voltage/line Vss. The gates of transistors PU-1 and PD-1 are connected to the drains of transistors PU-2 and PD-2, which form a connection node that is referred to as SD node 110. The gates of transistors PU-2 and PD-2 are connected to the drains of transistors PU-1 and PD-1, which connection node is referred to as SD node 112. A source/drain region of pass-gate transistor PG-1 is connected to bit line BL 114 at a BL node. A source/drain region of pass-gate transistor PG-2 is connected to bit line BLB 116 at a BLB node.

Figure 2:
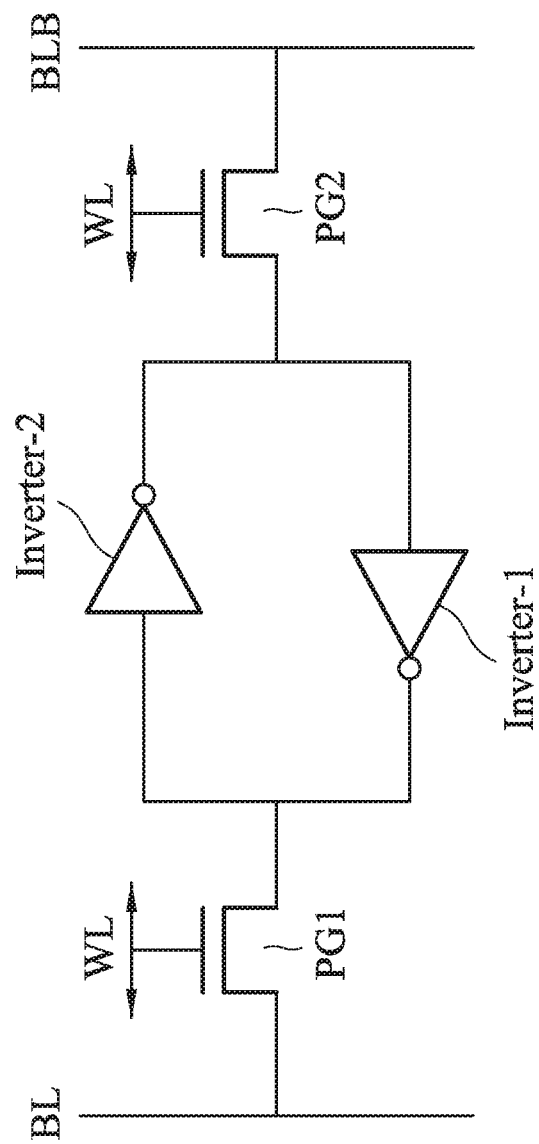

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
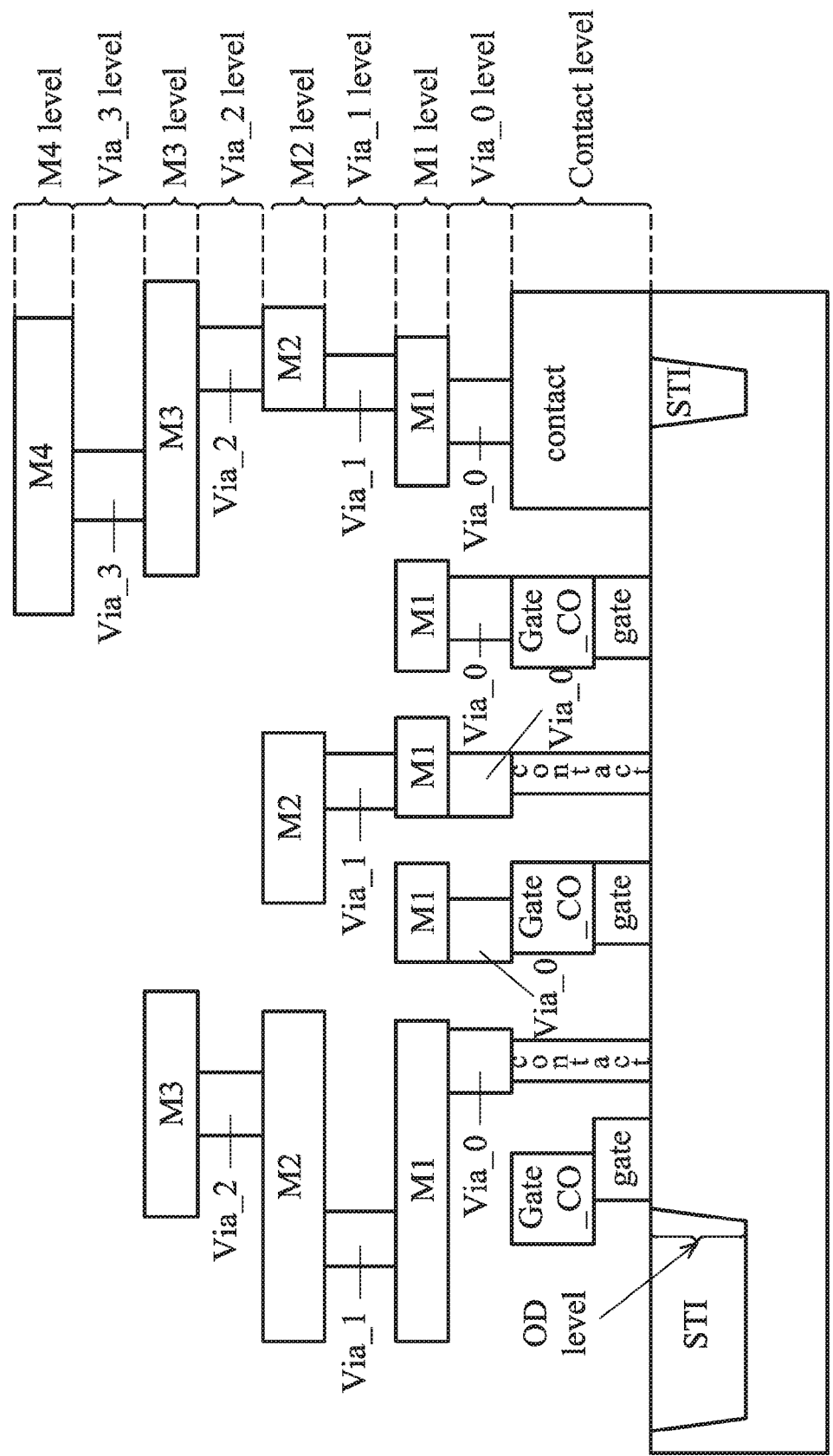
FIG. 3 illustrates a cross-sectional view of the layers involved in an SRAM cell array in accordance with some embodiments.

FIG. 3 illustrates a schematic cross-sectional view of a plurality of layers involved in SRAM cell 10, which layers are formed on a semiconductor chip or wafer. It is noted that FIG. 3 is schematically illustrated to show various levels of interconnect structure and transistors, and may not reflect the actual cross-sectional view of SRAM cell 10. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Figure 4:
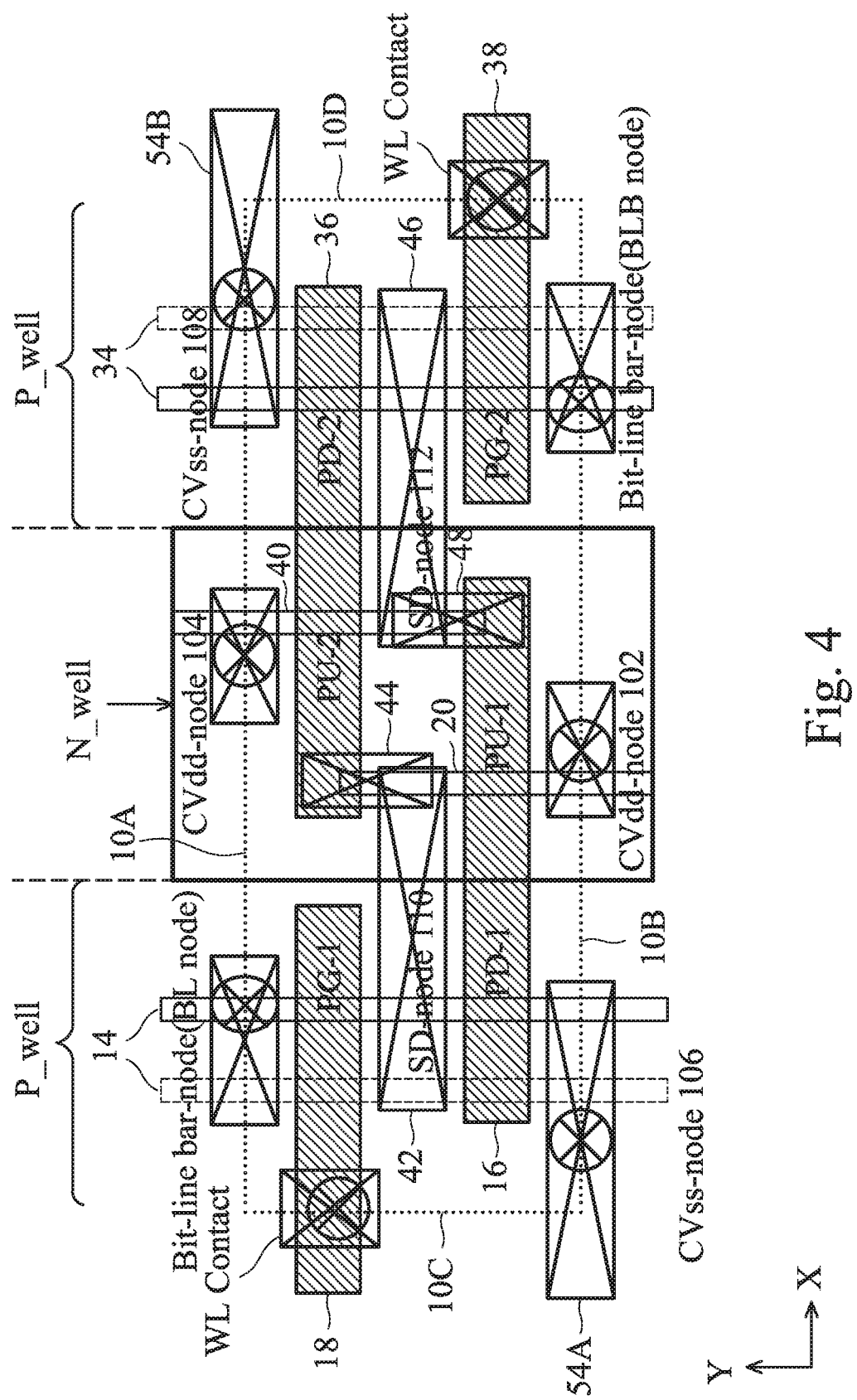
FIG. 4 illustrates a layout of front-end features of an SRAM cell in accordance with embodiments.

FIG. 4 illustrates a layout of the front-end features of SRAM cell 10 in accordance with exemplary embodiments, wherein the front-end features includes the features in the Via_0 level (FIG. 1) and the levels underlying the Via_0 level. The outer boundaries 10A, 10B, 10C, and 10D of SRAM cell 10 are illustrated using dashed lines, which mark a rectangular region. An N_well region is at the middle of SRAM cell 10, and two P_well regions are on opposite sides of the N_Well region. CVdd node 102, CVdd node 104, CVss node 106, CVss node 108, the bit-line (BL) node, and the bit-line bar (BLB) node, which are shown in FIG. 1, are also illustrated in FIG. 4. Gate electrode 16 forms pull-up transistor PU-1 with the underlying active region (in the n-well region) 20, which may be fin-based, and hence are referred to fin 20 hereinafter. Gate electrode 16 further forms pull-down transistor PD-1 with the underlying active regions (in the first P_well region on the left side of the N_well region) 14, which may be fin-based. Gate electrode 18 forms pass-gate transistor PG-1 with the underlying active region 14. Gate electrode 36 forms pull-up transistor PU-2 with the underlying active region (in the n_well region) 40. Gate electrode 36 further forms pull-down transistor PD-2 with the underlying active region (in the second P_well region on the right side of the N_well region) 34. Gate electrode 38 forms pass-gate transistor PG-2 with the underlying active region 34. In accordance with some embodiments of the present disclosure, pass-gate transistors PG-1 and PG-2, pull-up transistors PU-1 and PU-2, and pull-down transistors PD-1 and PD-2 are Fin Field-Effect Transistors (FinFETs). In accordance with alternative embodiments of the present disclosure, pass-gate transistors PG-1 and PG-2, pull-up transistors PU-1 and PU-2, and pull-down transistors PD-1 and PD-2 are planar MOS devices.

FIG. 4 illustrates two fins 14 (and two fins 34) in accordance with some embodiments. In accordance with other embodiments, there may be a single fin, two fins, or three fins, wherein one of the fins 14 (and one of fins 34) is illustrated as dotted to indicate the additional fins that may or may not exist.

As shown in FIG. 4, SD node 110 includes source/drain contact plug 42 and gate contact plug 44, which are the features at the contact level (FIG. 2). Contact plug 42 is elongated and has a longitudinal direction in the X direction, which is parallel to the extending directions of gate electrodes 16 and 36. Gate contact plug 44 comprises a portion over, and is electrically connected to, gate electrode 36. In accordance with some embodiments of the present disclosure, gate contact plug 44 has a longitudinal direction in the Y direction, with is perpendicular to the X direction. In the manufacturing of the SRAM cell 10 on physical semiconductor wafers, contact plugs 42 and 44 may be formed as a single continuous butted contact plug.

SD node 112 includes source/drain contact plug 46 and gate contact plug 48. Gate contact plug 48 has a portion overlapping source/drain contact plug 46. Since SD node 110 may be symmetric to SD node 112, the details of gate contact plug 48 and source/drain contact plug 46 are not repeated herein, and may be found referring to the discussion of gate contact plug 44 and source/drain contact plug 42, respectively.

FIG. 4 also illustrates word line contacts (marked as WL contacts) connected to gate electrodes 18 and 38. Furthermore, a plurality of vias, each illustrated using a circle and a "x" sign in the circle, is over and contacting the respective underlying contact plugs. Elongated contact plugs 54A and 54B are used to connect to the source regions of pull-down transistors PD-1 and PD-2, respectively, to CVss lines. Elongated contact plugs 54A and 54B are parts of the CVss-nodes 106 and 108, respectively. Elongated contact plugs 54A and 54B have lengthwise directions parallel to the X direction, and may be formed to overlap the corners of SRAM cell 10. Furthermore, elongated contact plugs 54A and 54B may further extend into neighboring SRAM cells that abut SRAM cell 10.

Figure 5:
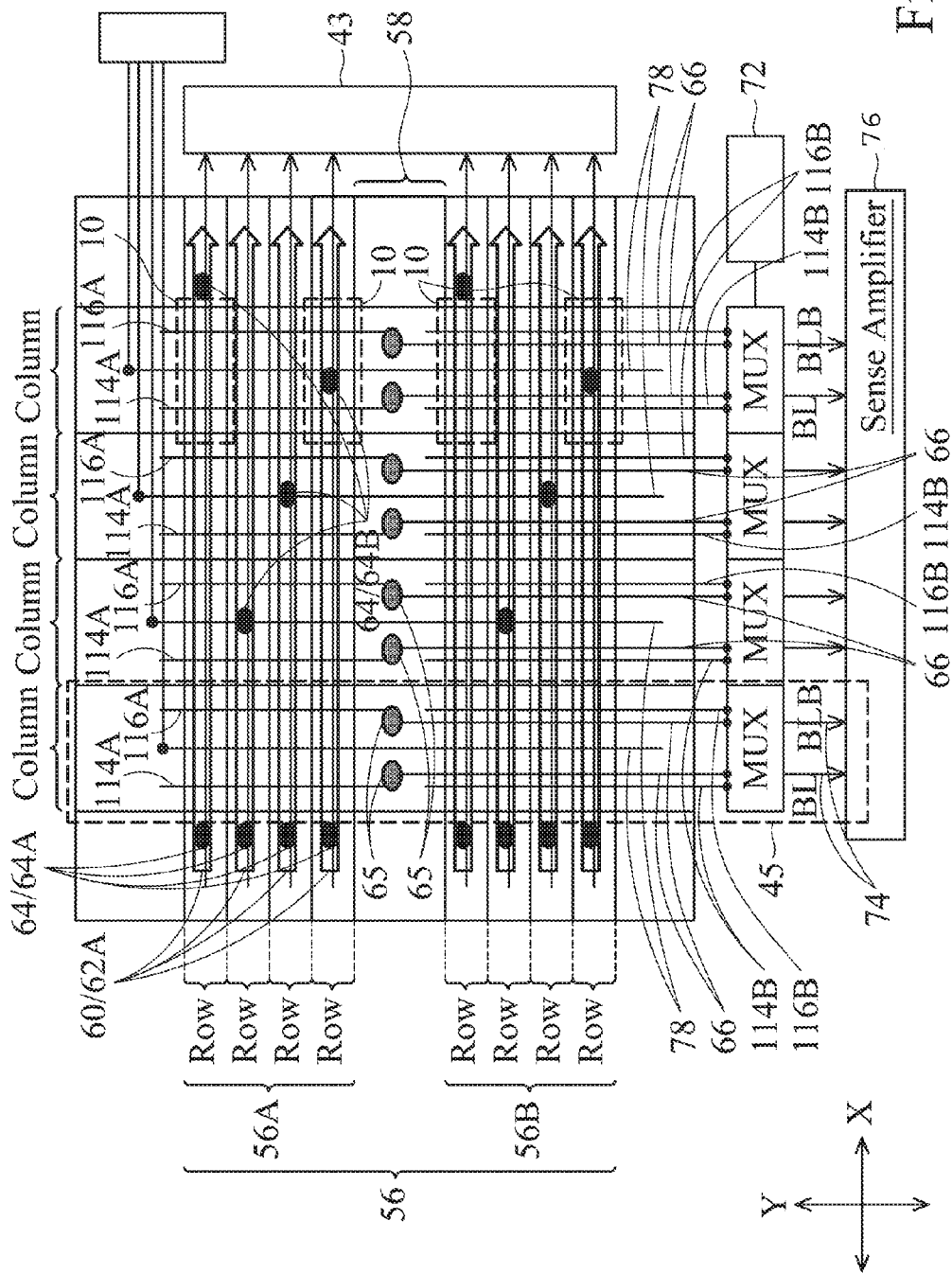
FIG. 5 illustrates an SRAM array including two sub-arrays in accordance with some embodiments.

FIG. 5 illustrates schematic view of SRAM array 56 and related circuits. The illustrated schematic SRAM array 56 includes 8 rows and 4 columns to simplify the explanation of the embodiments. The actual SRAM array 56 may have a greater number of rows and columns. For example, the number of rows may be 64, 128, 256, 512, or more, and the number of columns may also be 64, 128, 256, 512, or more. The SRAM cells in SRAM array 56 may have the structure shown in FIGS. 1, 2, and 4. Some exemplary SRAM cells 10 in SRAM array 56 are marked.

Figure 7:
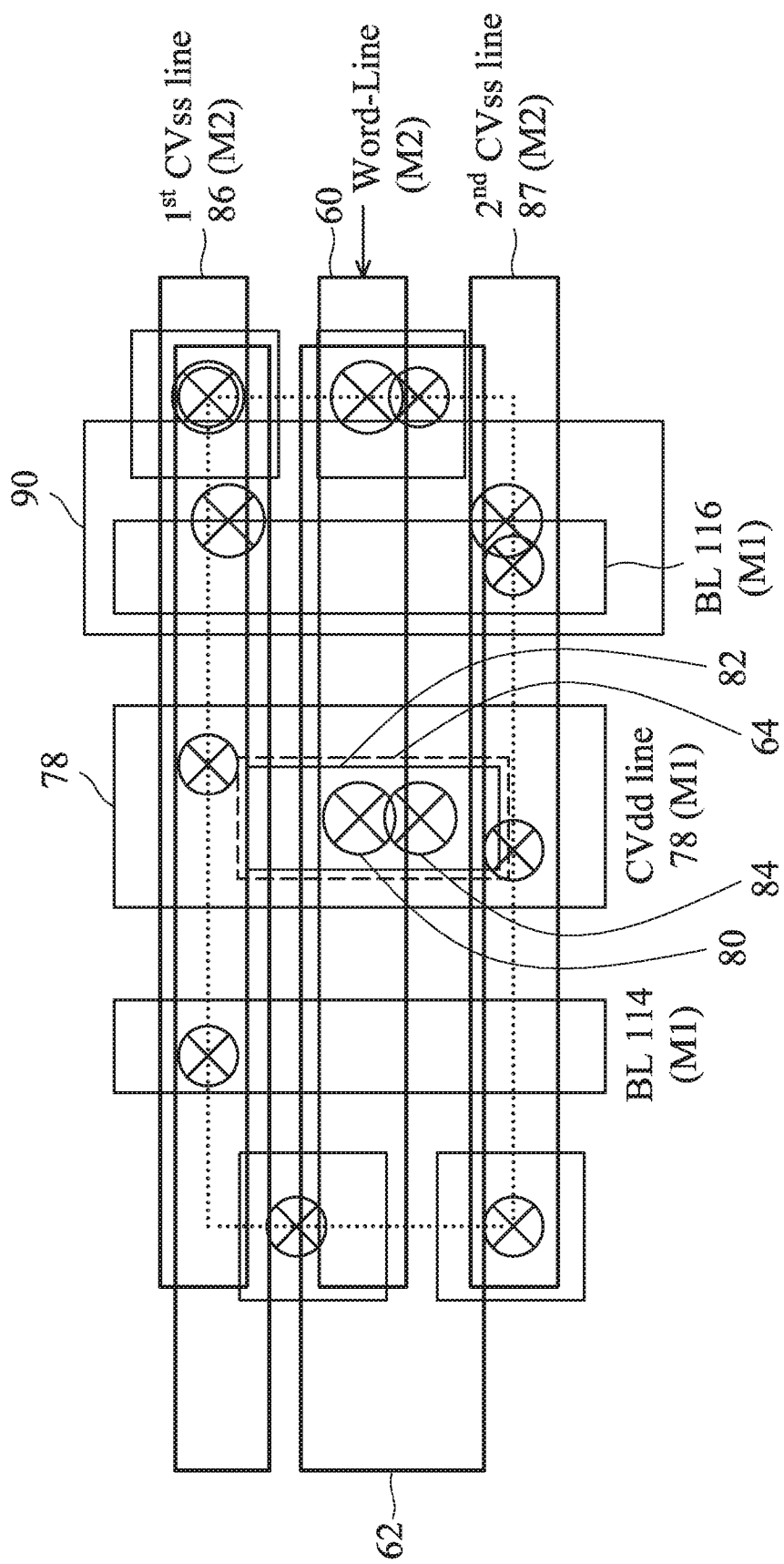
FIG. 7 illustrates a layout of an SRAM cell in accordance with some embodiments.

SRAM array 56 is divided into two sub-arrays 56A and 56B, which are separated from each other by jumper structure 58. Sub-arrays 56A and 56B have different rows and same columns. For example, When SRAM array 56 is a 256×256 array, sub-array 56A has rows 1 through 128, and columns 1 through 256. Sub-array 56B has rows 129 through 256, and the same columns 1 through 256. Jumper structure 58 includes a plurality of strap cells, each in one column of SRAM array 56. One of strap cells 47 is illustrated. The lengths (in the row direction, which is shown as X direction) of the strap cells are the same as the lengths of the respective columns. Strap cells (and hence the jumper structure 58) have no SRAM cells formed therein. In accordance with some embodiments of the present disclosure, a plurality of word-lines 60 and 62 (marked as 60/62) are placed in pairs in the row direction, with each pair of word-lines 60 and 62 extending into one row of SRAM cells 10. Word-lines 60 and 62 are connected to word-line driver 43, which provides appropriate word-line signals for selected and un-selected rows. In accordance with alternative embodiments of the present disclosure, word line 60 is formed, while word-line 62 is not formed. Word-line 60 may be formed in the M2 level (FIG. 3), and word-line 62 may be formed in the M4 level, as also shown in FIG. 7. Furthermore, each of word-lines 60 and 62 extends all the way through the entirety of the respective row, and is connected to CVdd nodes 102 (FIGS. 1 and 4) of all SRAM cells 10 in the respective row.

Sub-array 56A includes a plurality of pairs of complementary bit-lines including bit-lines 114A (which correspond to BL 114 in FIG. 1) and their complementary bit-lines 116A (which correspond to BLB 116 in FIG. 1). Bit-lines 114A and 116A extend in the column direction. The complementary bit-lines are used to carry complementary bit-line signals. Each of bit-lines 114A is connected to the drain regions of pass-gate transistors PG-1 (FIG. 1) in the respective column of SRAM cells 10 in sub-array 56A. Each of bit-lines 116A is connected to the drain regions of pass-gate transistors PG-2 (FIG. 1) in the respective column of SRAM cells 10 in sub-array 56A. In accordance with some embodiments of the present disclosure, bit-lines 114A and 116A are in a low metal layer such as M1 level/layer (FIG. 3).

Sub-array 56B includes a plurality of pairs of complementary bit-lines including bit-lines 114B (which correspond to BL 114 in FIG. 1) and their complementary bit-lines 116B (which correspond to BLB 116 in FIG. 1). Bit-lines 114B and 116B extend in the column direction. Each of bit-lines 114B is connected to the drain regions of pass-gate transistors PG-1 (FIG. 1) in the respective column of SRAM cells 10 in sub-array 56B. Each of bit-lines 116B is connected to the drain regions of pass-gate transistors PG-2 (FIG. 1) in the respective column of SRAM cells 10 in sub-array 56B. In accordance with some embodiments of the present disclosure, bit-lines 114B and 116B are also in a low metal layer such as M1 level/layer (FIG. 3).

Figure 6:
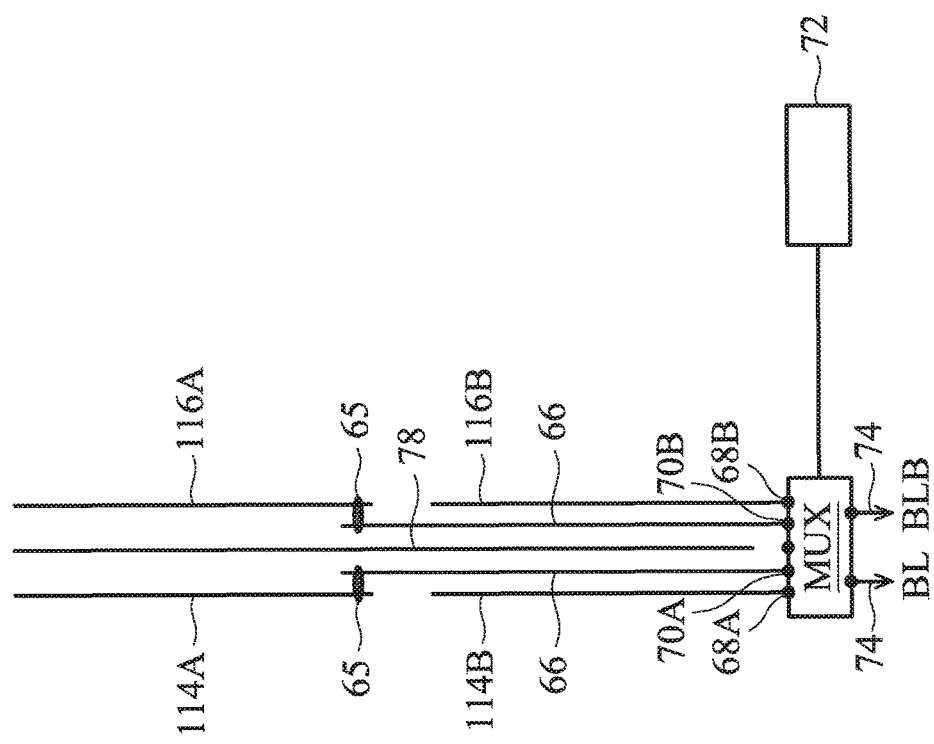
FIG. 6 illustrates complementary bit-lines and a CVdd line connected to two sub-arrays in accordance with some embodiments.

FIG. 6 illustrates a schematic view of the bit-lines 114A, 114B, 116A, and 116B that are in the same column of SRAM array 56. The illustrated portion may be in the region marked using a rectangular box 45 in FIG. 5. The structure shown in FIG. 6 is repeated for each of the columns, as also shown in FIG. 5. Referring to FIG. 6, bit-lines 114B and 116B are connected to input nodes 68A and 68B, respectively, of multiplexer MUX. Bit-lines 114A and 116A are connected to metal lines 66, which are further connected to input nodes 70A and 70B. Accordingly, bit-lines 114A and 116A are also electrically connected to input nodes 70A and 70B, respectively. The connection between bit-lines 114A and 116A and the respective metal lines 66 is through connection modules 65. Metal lines 66 cross over, without being connected to, sub-array 56B (FIG. 5). Alternatively stated, although metal lines 66 cross over sub-array 56B, metal lines 66 are not connected to the underlying SRAM cells 10 in sub-array 56B. Accordingly, metal lines 66 are alternatively referred to as bridging lines throughout the description. As also shown in FIG. 5, bridging lines 66 terminate in jumper structure 58, and may terminate in the respective strap cells separating the SRAM cells in sub-array 56A from the SRAM cells in sub-array 56B.

Bit-lines 114A and 114B are physically disconnected from each other. Although in the same column of SRAM array 56, bit-lines 114A and 114B are electrically disconnected from each other, and are configured to carry different signals in the operation of SRAM array 56. Similarly, Bit-lines 116A and 116B are physically disconnected from each other. Although in the same column of SRAM array 56, bit-lines 116A and 116B are electrically disconnected from each other, and are configured to carry different signals in the operation of SRAM array 56.

As shown in FIGS. 5 and 6, multiplexer MUX is connected to control unit 72, which provides enable control signals to operate multiplexer MUX, so that either the signals on bit-lines 114A and 116A are selected, and are forwarded to output nodes 74 of multiplexer MUX, or the signals on bit-lines 114B and 116B are selected, and are forwarded to output nodes 74. At one time, at most one of the complementary pairs 114A/116A and 114B/116B is selected by multiplexer MUX. The selected signals on either bit-line pair 114A/116A or bit-line pair 114B/116B are provided to sense amplifier circuit 76.

Since bit-lines 114A and 116A are connected to sub-array 56A, but not to sub-array 56B, and bit-lines 114B and 116B are connected to sub-array 56B, but not to sub-array 56A, regardless of whether bit-line pair 114A/116A is selected or bit-line pair 114B/116B is selected, the selected bit-line pair is connected to a half of the SRAM cells in the selected column. When a row in sub-array 56A is selected for read operation, bit-lines 114A and 116A are selected, and their signals are output to output nodes 74. Similarly, when a row in sub-array 56B is selected for read operation, bit-lines 114B and 116B are selected, and their signals are output to output nodes 74. One of output nodes 74 is marked as BL and BLB in FIGS. 5 and 6 to indicate that output nodes 74 carry signals from the commentary bit-line pairs.

Advantageously, since each of bit-line pairs 114A/116A and 114B/116B is connected to a half of the SRAM cells in the respective column, the load on bit-lines and sense amplifier circuit 76 is reduced by a half, and the differential speed of SRAM cell array 56 may be improved by about 20 percent to about 30 percent. It is appreciated that although sub-arrays 56A and 56B are connected to different bit-lines, they are still the parts of the same SRAM array since they are connected to the same multiplexer, and their signals are sensed by the same sense amplifier in sense amplifier circuit 76.

Referring again to FIG. 5, a plurality of CVdd lines 78 (also shown in FIG. 6), which carries CVdd power supply, is disposed in SRAM array 56. In accordance with some embodiments of the present disclosure, each of CVdd lines 78 continuously extends into both sub-array 56A and sub-array 56B, and further into jumper structure 58. Accordingly, sub-arrays 56A and 56B receive the CVdd power supply at the same time, regardless of which of sub-arrays 56A and 56B is selected for (read or write) operation.

FIG. 7 illustrates the layout of metal lines in SRAM cells 10 in SRAM cell array 56 (FIG. 5) in accordance with some embodiments, wherein one SRAM cell 10 is illustrated as an example. In accordance with some embodiments of the present disclosure, the word-line performance is improved through double word-line scheme, as shown in FIG. 7. For example, word-line 60 is located in a lower metal layer, which may be at M2 level (FIG. 3). Word-line 62 is located in an upper metal layer, which may be at M4 level (FIG. 3). Word-lines 60 and 62 are interconnected through connection module 64, which includes via 80 at via_2 level, metal pad 82 at M3 level, and via 84 at via_3 level, wherein the via levels and metal levels are shown in FIG. 3. Through the connection of connection module 64, word-lines 60 and 62 act as a single metal line with an increased thickness, and hence reduced resistance, and hence the RC delay of word-lines is reduced.

Referring back to FIG. 5, word-line connection modules 64 may include 64A and/or 64B. Word-line connection modules 64 may be located inside or outside SRAM cells 10. For example, word-line connection modules 64A are located outside of the SRAM cells 10. Word-line connection modules 64B, on the other hand, are inside SRAM cells 10, and may be placed with a repeated pattern, such as every 8, 16, 32, etc. SRAM cells.

FIG. 7 also illustrates that CVss line 86 and/or CVss line 87 are placed in the M2 level (FIG. 3), wherein one or both of CVss lines 86 and 87 may be overlapped by word-line 62. Furthermore, CVss lines 86 and 87 are placed on the opposite sides of word-line 60.

Figure 8:
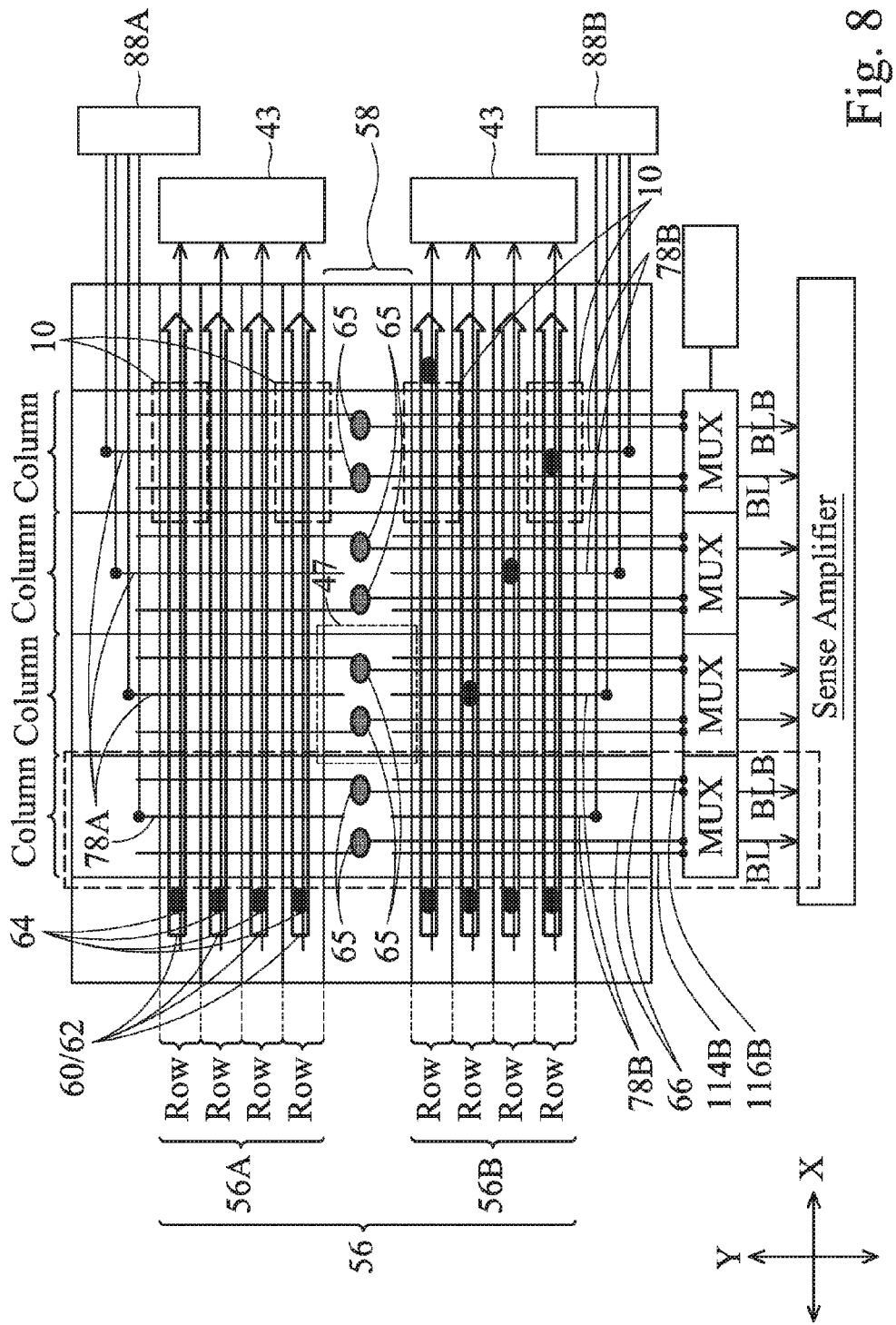
FIG. 8 illustrates an SRAM array including two sub-arrays in accordance with some embodiments.

FIG. 8 illustrates SRAM array 56 in accordance with some embodiments of the present disclosure. Unless specified otherwise, the connection and the layout of the components in these embodiments are essentially the same as the like components, which are denoted by like reference numerals in the embodiments shown in FIGS. 5 through 7. The details of the like components thus may not be repeated herein.

As shown in FIG. 8, in each column of SRAM array 56, there are two CVdd lines, namely 78A and 78B, which are disconnected from each other. Each of CVdd lines 78A and 78B may or may not extend into jumper structure 58. CVdd lines 78A and 78B are physically and electrically disconnected from each other, and may carry different power supply voltages without affecting each other. For example, if a row in sub-array 56A is selected (for read or write operation), CVdd line 78A is provided with a full CVdd voltage in order to operate the selected row. In the meantime, since sub-array 56B is not operated, CVdd line 78B may be provided with a partial power supply voltage lower than the full CVdd voltage or the full CVdd voltage. The partial power supply voltage may be lower than about 50 percent or lower than about 30 percent of the full power supply voltage in order to preserve power, depending the intended saving in power and the designed speed of transition from idle mode (with partial power) to full operation mode (with full power).

CVdd lines 78A are electrically connected to, and are supplied with power supply voltages by, CVdd power source 88A. CVdd lines 78B are electrically connected to, and are supplied with power supply voltages by, CVdd power source 88B. CVdd power sources 88A and 88B may operate individually (without affecting and rely upon each other) to provide the desired power supply voltages to CVdd lines 78A and 78B.

Throughout the description, bit-lines 114A and 116A are also considered as two separate portions divided from a bit-line, bit-lines 114B and 116B are also considered as two separate portions divided from a complementary bit-line, and CVdd lines 78A and 28B are also considered as two separate portions divided from a CVdd line.

Referring to FIG. 7, CVdd line 78 (as also shown as 78, 78A, and/or 78B in FIGS. 5, 6, and 8) extends in the column direction. In accordance with some embodiments, CVdd line 78 is located in a low metal layer such as at M1 layer (FIG. 3). Bit-lines 114 and 116 (as also shown as 114A, 114B, 116A, and 116B) in FIGS. 5, 6, and 8) may also be in the same metal layer (such as M1) as CVdd line 78. CVss line 90 may be placed in the M3 level (FIG. 3) to form a power mesh with CVss lines 86 and 87 at the M1 level.

The embodiments of the present disclosure have some advantageous features. By separating bit-lines into two portions, each connected to the SRAM cells in one of sub-arrays, the loading of the bit-lines is reduced, and the bit-line speed is improved. The sensing speed of sense amplifier is also increased. Also, through the use of double word-lines, the resistance of word-lines is reduced, resulting in the reduction of RC delay. In addition, by separating the CVdd power supplies of the sub-arrays in a same SRAM array, the power consumption is reduced.

In accordance with some embodiments of the present disclosure, an integrated circuit structure includes an SRAM array including a first sub-array having a first plurality of rows and a plurality of columns of SRAM cells, and a second sub-array having a second plurality of rows and the plurality of columns of SRAM cells. Each of the SRAM cells in the SRAM array includes a first and a second pull-up MOS device, a first and a second pull-down MOS device forming cross-latched inverters with the first and the second pull-up MOS devices, and a first and a second pass-gate MOS device connected to the cross-latched inverters. A first bit-line and a first complementary bit-line are connected to the first and the second pass-gate MOS devices of SRAM cells in a column in the first sub-array. A second bit-line and a second complementary bit-line are connected to the first and the second pass-gate MOS devices of SRAM cells in the column in the second sub-array. The first bit-line and the first complementary bit-line are disconnected from the second bit-line and the second complementary bit-line. A sense amplifier circuit is electrically coupled to, and configured to sense, the first bit-line, the first complementary bit-line, the second bit-line, and the second complementary bit-line.

In accordance with some embodiments of the present disclosure, an integrated circuit structure includes an SRAM array including a first sub-array having a first plurality of rows and a plurality of columns of SRAM cells, and a second sub-array having a second plurality of rows and the plurality of columns of SRAM cells. Each of the SRAM cells in the SRAM array includes a first and a second pull-up MOS device, a first and a second pull-down MOS device forming cross-latched inverters with the first and the second pull-up MOS devices, and a first and a second pass-gate MOS device connected to the cross-latched inverters. A first bit-line, a first complementary bit-line, and a first CVdd line are in a first metal layer and connected to a column of the SRAM cells in the first sub-array. A second bit-line, a second complementary bit-line, and a second CVdd line are in the first metal layer, and connected to the column of the SRAM cells in the second sub-array. A first power source and a second power source are connected to the first CVdd line and the second CVdd line, respectively. A first bridging line and a second bridging line cross over the second sub-array and connected to the first bit-line and the first complementary bit-line, respectively. A multiplexer is connected to the second bit-line, the second complementary bit-line, the first bridging line, and the second bridging line, respectively.

In accordance with some embodiments of the present disclosure, an integrated circuit structure includes an SRAM array including a first sub-array having a first plurality of rows and a plurality of columns of SRAM cells, and a second sub-array including a second plurality of rows and the plurality of columns of SRAM cells. Each of the SRAM cells in the SRAM array includes a first pull-up MOS device and a second pull-up MOS device, and a first pull-down MOS device and a second pull-down MOS device forming cross-latched inverters with the first pull-up MOS device and the second pull-up MOS device. A bit-line and a complementary bit-line are each physically separated into a first portion and a second portion, wherein the first portions of the bit-line and the complementary bit-line are connected to the first sub-array and not to the second sub-array, and the second portions of the bit-line and the complementary bit-line are connected to the second sub-array and not to the first sub-array. A multiplexer includes four input nodes, each connected to one of the first and the second portions of the bit-line and the first and the second portions of the complementary bit-line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   sensing a first signal from a first bit-line, wherein the first bit-line is connected to first Static Random Access Memory (SRAM) cells of a first sub-array in an SRAM array;
   sensing a second signal from a second bit-line, wherein the second bit-line is connected to second SRAM cells of a second sub-array in the SRAM array;
   conducting the first signal to a multiplexer through metal lines that are directly over the second sub-array;
   conducting the second signal to the multiplexer;
   selecting a signal on one of the first bit-line and the second bit-line using the multiplexer and sending a corresponding one of the first signal and the second signal on the selected one of the first bit-line and the second bit-line to a sensing amplifier.

2. The method of claim 1, wherein at any time, at most one of the first signal and the second signal is output to the sensing amplifier.

3. The method of claim 1, wherein the metal lines are electrically disconnected from the second sub-array.

4. The method of claim 1 further comprising amplifying the one of the first signal and the second signal using the sensing amplifier.

5. The method of claim 1 further comprising providing power to both the first sub-array and the second sub-array through a same CVDD line.

6. The method of claim 1 further comprising providing power to a same column of the first sub-array and the second sub-array through a first CVDD line and a second CVDD line, respectively, wherein the first CVDD line is disconnected from the second CVDD line.

7. The method of claim 6, wherein the first CVDD line and the second CVDD line receive power from a first CVDD power source and a second CVDD power source, respectively.

8. The method of claim 6 further comprising, when the first signal is output to the sensing amplifier:
   providing a full power to the first CVDD line; and
   providing a partial power lower than the full power to the second CVDD line.

9. The method of claim 1, wherein the first signal is sent to the sensing amplifier at a first time, and the method further comprises, at a second time, sending the second signal to the sensing amplifier.

10. A method comprising:
    sensing a first bit-line signal from a first bit-line connected to a first sub-array of a Static Random Access Memory (SRAM) array;
    sensing a second bit-line signal from a second bit-line connected to a second sub-array of the SRAM array;
    conducting the first bit-line signal to a metal line that is directly over the second sub-array, wherein the metal line is disconnected from the second sub-array;
    conducting the first bit-line signal through the metal line to a multiplexer;
    at a first time, amplifying the first bit-line signal using a sensing amplifier;
    at a second time, amplifying the second bit-line signal using the sensing amplifier; and
    providing power to a same column of the first sub-array and the second sub-array through a first CVDD line and a second CVDD line, respectively, wherein the first CVDD line is disconnected from the second CVDD line.

11. The method of claim 10 further comprising outputting one of the first bit-line signal and the second bit-line signal to the sensing amplifier.

12. The method of claim 10, wherein the first bit-line and the second bit-line are in a same column in the first sub-array and the second sub-array, and are disconnected from each other.

13. The method of claim 10 further comprising, at the first time when the first bit-line signal is output to the sensing amplifier, providing a full power to the first CVDD line, and providing a partial power lower than the full power to the second CVDD line.

14. The method of claim 13 further comprising, at the second time when the second bit-line signal is output to the sensing amplifier, providing the full power to the second CVDD line, and providing the partial power to the first CVDD line.

15. The method of claim 10, wherein the first sub-array and the second sub-array are connected to different CVDD power sources.

16. A method comprising:
    sensing a first signal from a first bit-line and a first complementary bit-line from a first sub-array of a Static Random Access Memory (SRAM) array;
    sensing a second signal from a second bit-line and a second complementary bit-line from a second sub-array of the SRAM array;
    conducting the first signal over the second sub-array to feed the second signal into a first input of a multiplexer, wherein the conducting the first signal over the second sub-array comprises conducting the first signal through a metal line that runs directly over the second sub-array;

feeding the second signal to a second input of the multiplexer; and selecting a signal on one of the first input and the second input using the multiplexer and sending a corresponding signal on the selected one of the first input and the second input to an output of the multiplexer.

17. The method of claim 16, wherein the metal line is disconnected from an entirety of the second sub-array.

18. The method of claim 16, wherein the first sub-array and the second sub-array are connected to a same word-line driver, and the first sub-array and the second sub-array are connected to a first CVDD line and a second CVDD line, respectively, wherein the first CVDD line is disconnected from the second CVDD line.

19. The method of claim 16, wherein the first signal and the second signal are fed to the multiplexer at different time.

20. The method of claim 16, wherein the first signal and the second signal are sent to the output of the multiplexer at different time.

* * * * *